United States Patent
Su et al.

(10) Patent No.: US 6,225,186 B1
(45) Date of Patent: May 1, 2001

(54) METHOD FOR FABRICATING LOCOS ISOLATION

(75) Inventors: Lin-Chin Su, Taipei Hsien; Tzu-Ching Tsai, Taichung Hsien; Minn-Jiunn Jiang, Taipei, all of (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 09/227,092

(22) Filed: Jan. 5, 1999

(30) Foreign Application Priority Data

Sep. 22, 1998 (TW) .................................................. 87115777

(51) Int. Cl.$^7$ ..................................................... H01L 21/76

(52) U.S. Cl. .......................................... 438/400; 438/439

(58) Field of Search ..................................... 438/400, 447, 438/431, 439, 443, 451, 452; 437/31, 40, 69, 70, 38, 67, 78

(56) References Cited

U.S. PATENT DOCUMENTS

| 4,835,115 | * | 5/1989 | Eklund | 437/38 |
| 4,897,364 | * | 1/1990 | Nguyen et al. | 437/69 |
| 5,298,451 | * | 3/1994 | Rao | 437/70 |
| 5,399,515 | * | 3/1995 | Davis et al. | 437/40 |
| 5,459,083 | * | 10/1995 | Subrahmanyan et al. | 437/31 |

* cited by examiner

Primary Examiner—David Nelms
Assistant Examiner—Phuc T. Dang
(74) Attorney, Agent, or Firm—Michael D. Bednarek; Shaw Pittman

(57) ABSTRACT

A method for fabricating a LOCOS isolation in accordance with the present invention, involves first forming a masking layer on the active region of a silicon substrate. Next, the masking layer is used as the etching mask and the silicon substrate is etched to form a recess. Then, a thin nitride layer is formed on the masking layer and the recess. Afterwards, a polysilicon layer is deposited on the thin nitride layer. Then, an etching process is applied to etch back the polysilicon and the thin nitride layer, thereby exposing the upper surface of the masking layer. Next, a LOCOS isolation is grown above the recess.

8 Claims, 5 Drawing Sheets

METHOD FOR FABRICATING LOCOS ISOLATION

BACKGROUND OF THE INVENTION

1. Field of the Invention

The present invention relates to a method for fabricating an isolation for a semiconductor device, and more particularly to a method for fabricating a local oxidation of silicon (LOCOS) isolation.

2. Description of the prior art

To improve the bird's beak (encroachment effect) at the edge of a LOCOS isolation, a polysilicon spacer serving as a buffer layer is widely used in the LOCOS isolation process.

Referring to FIGS. 1A through 1E, the cross-sectional side views of a conventional method for fabricating a LOCOS isolation are depicted in sequence.

Referring now to FIG. 1A, a cross-sectional view of the starting step is schematically shown. In FIG. 1A, a first pad oxide layer 12 and a silicon nitride layer 14 are sequentially formed on the active region of a silicon substrate 10. Then, using silicon nitride layer 14 as an etching mask, the silicon substrate 10 is etched to form a recess 15 by anisotropic etching.

Next, as shown in FIG. 1B, a second pad oxide 16 is formed on the surface of the recess 15 by thermal oxidation, which preferably uses a gas containing $O_2$ as the reactive gas.

Now as shown in FIG. 1C, a polysilicon spacer 18, which extends the recess 15, is formed on the side walls of the silicon nitride layer 14. The polysilicon spacer 18 can be formed by the steps of depositing, and etching back a polysilicon layer. A thin silicon nitride layer 20 is deposited on the surface of the polysilicon spacer 18 by selective chemical vapor deposition.

Referring now to FIGS. 1C and 1D, a local oxide 22 (isolation), which has a deeper concave portion 24, is grown above the recess 15 by thermal oxidation.

Next, referring to FIG. 1E, the silicon nitride layer 14 is removed via wet etching to leave local oxide 22a.

However, the LOCOS isolation process suffers from problems, for example the deeper concave portion 24 can cause an uneven surface. Moreover, the thin silicon nitride layer 20 formed on the surface of the polysilicon spacer 18 limits the oxidation of polysilicon spacer 18. Therefore, a portion of polysilicon spacer 18 does not react into local oxide 22 during the thermal oxidation step. Also, the conventional method described above may cause the encroachment to be too large.

SUMMARY OF THE INVENTION

In view of the above disadvantages, an object of the invention is to provide a method for fabricating a LOCOS isolation by changing the thin silicon nitride layer and the polysilicon layer steps.

The above object is attained by providing a method for fabricating a LOCOS isolation, which comprises the steps of (a) forming a masking layer on the active region of a silicon substrate; (b) anisotropically etching said silicon substrate by using said masking layer as an etching mask, thereby forming a recess; (c) depositing a thin nitride layer; (d) depositing a polysilicon layer on said thin nitride layer; (e) etching back said polysilicon layer and said thin nitride layer to expose the surface of said masking layer, thereby forming a polysilicon spacer extending said recess and said masking layer; (f) growing a local oxidation of silicon (LOCOS) isolation above said recess, said isolation forming on the side wall of said masking layer.

An aspect of the invention is to provide a method for fabricating a LOCOS isolation, wherein said masking layer is a silicon nitride layer.

BRIEF DESCRIPTION OF THE DRAWINGS

The preferred embodiment of the invention is hereinafter described with reference to the accompanying drawings in which.

DETAILED DESCRIPTION OF THE PREFERRED EMBODIMENTS

The preferred embodiment of the invention is illustrated in FIGS. 2A through 2G of the drawings.

Figure 1A:
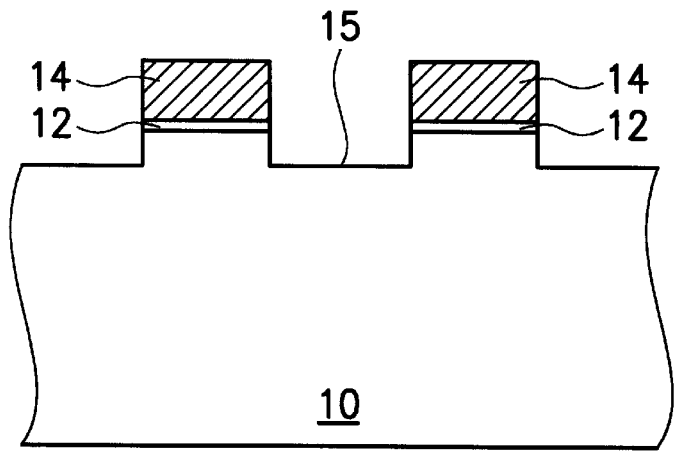
FIGS. 1A through 1E are cross-sectional side views showing the manufacturing steps of a LOCOS isolation of the prior art.
Figure 1B:
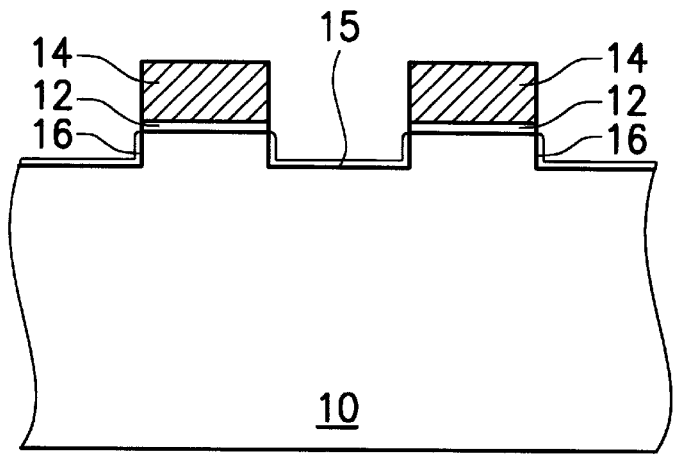
Figure 1C:
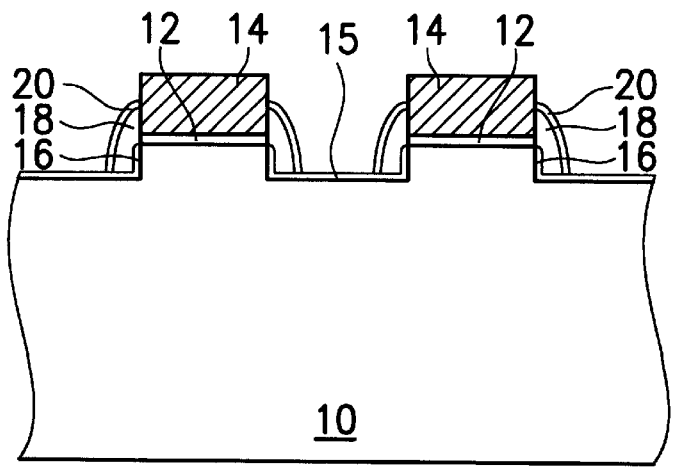
Figure 1D:
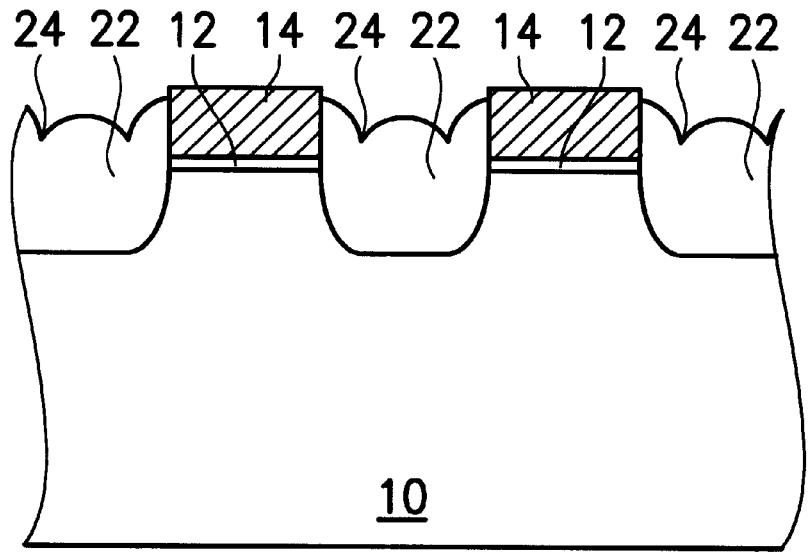
Figure 1E:
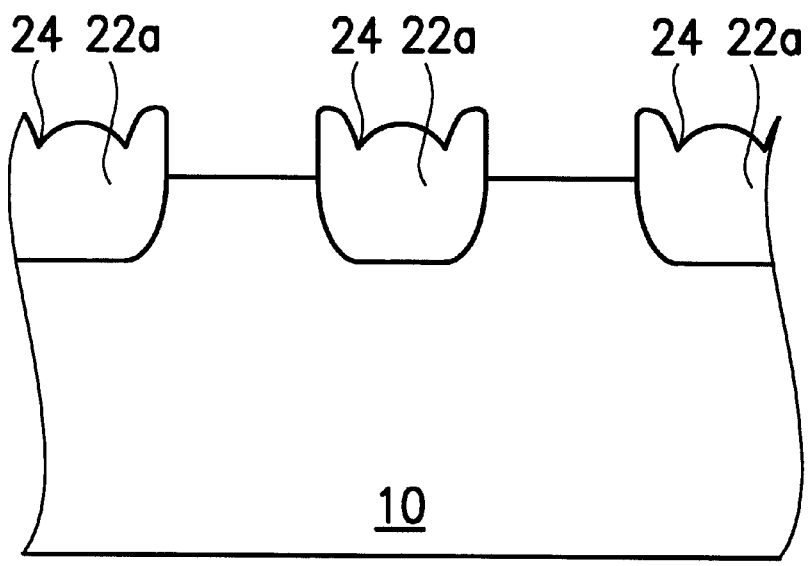
Figure 2A:
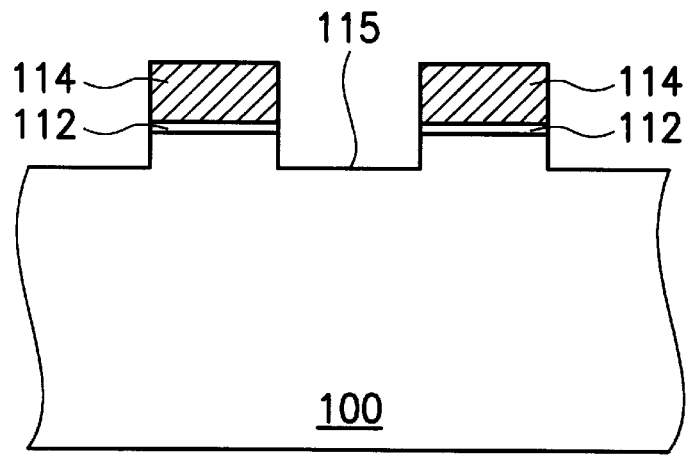
FIGS. 2A through 2G are cross-sectional side views show the manufacturing steps of a LOCOS isolation of the invention.

Referring now to FIG. 2A, a cross-sectional view of the starting step is schematically shown. In FIG. 2A, a first pad oxide layer 112 and a masking layer 114, such as a silicon nitride layer having a thickness in the range of approximately 1200 to 1800 angstroms, are sequentially formed on the active region of a silicon substrate 100. The first pad oxide layer 112 has a thickness of approximately 160 angstroms. Then, using masking layer 114 as an etching mask, the silicon substrate 100 is etched by anisotropic etching to form a recess 115 having a depth of somewhere between 300 and 700 Angstroms.

Figure 2B:
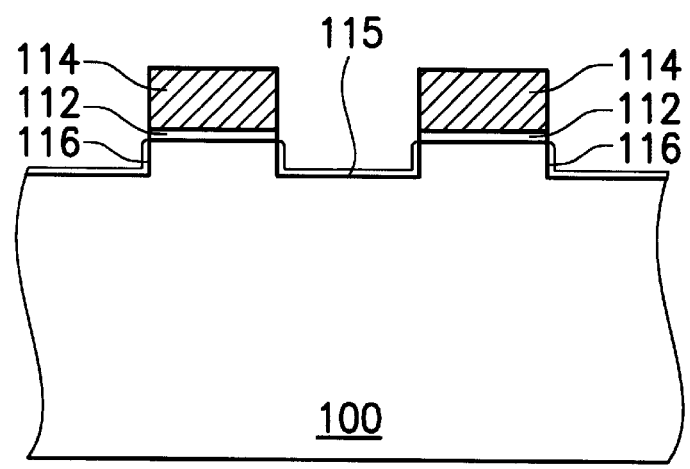

Next, as shown in FIG. 2B, a second pad oxide 116, having a thickness of approximately 100 Angstroms, is formed on the surface of the recess 115 by thermal oxidation, which preferably uses a gas containing $O_2$ as the reactive gas.

Figure 2C:
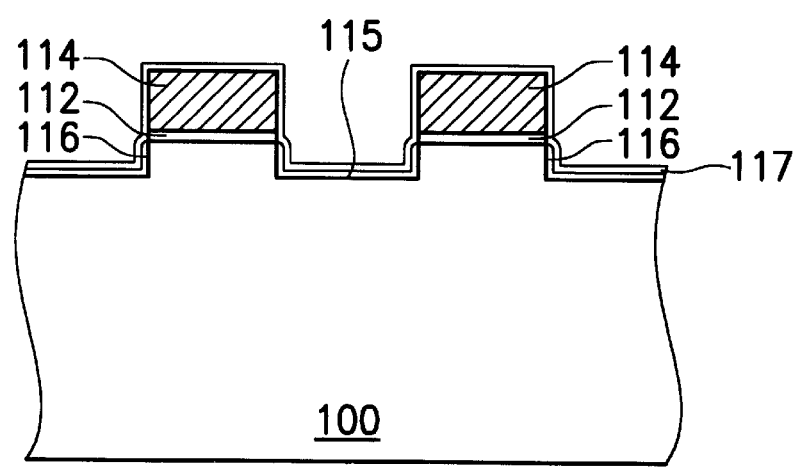

Now, as shown in FIG. 2C, a thin nitride layer 117, such as a silicon nitride thin layer or a silicon oxynitride layer having a thickness of approximately 50 to 100 Angstroms, is deposited by using chemical vapor deposition.

Figure 2D:
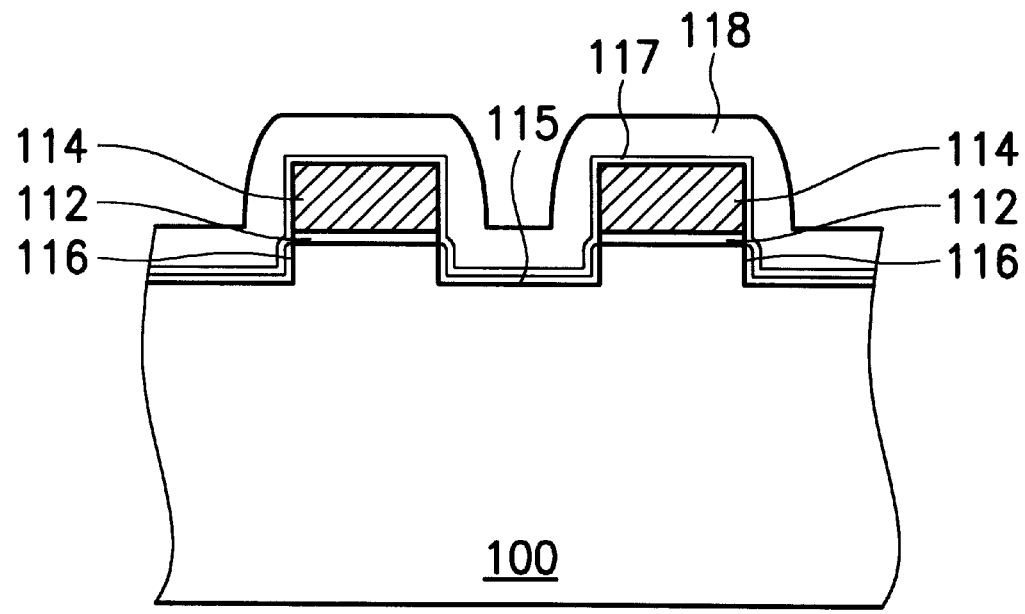

Referring now to FIG. 2D, a polysilicon layer 118 is deposited on the surface of the thin nitride layer 117 by chemical vapor deposition, which uses a gas containing silicon, for example $SiH_4$ or $SiCl_2$, as the reactive gas.

Figure 2E:
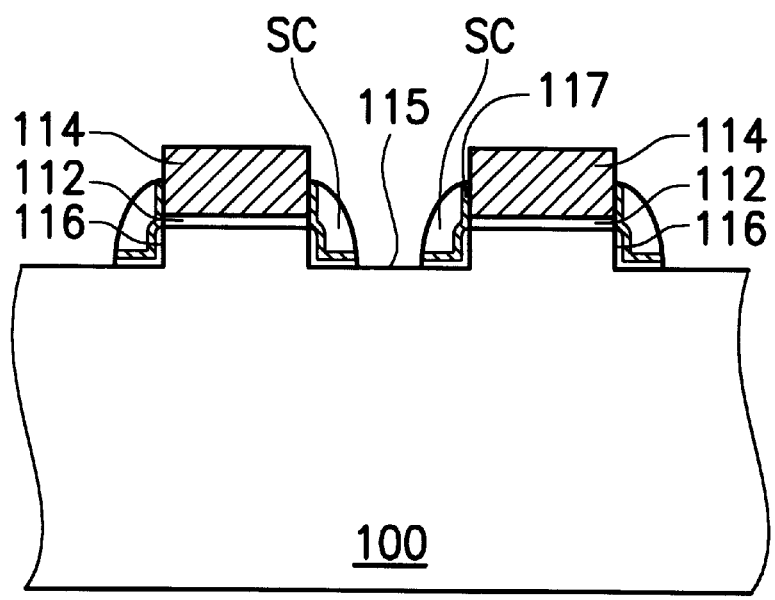

Referring now to FIGS. 2D and 2E, a spacer SC extending the recess 115 and the masking layer 114 is typically formed by anisotropically etching back of the polysilicon layer 118 and thin nitride layer 117.

Figure 2F:
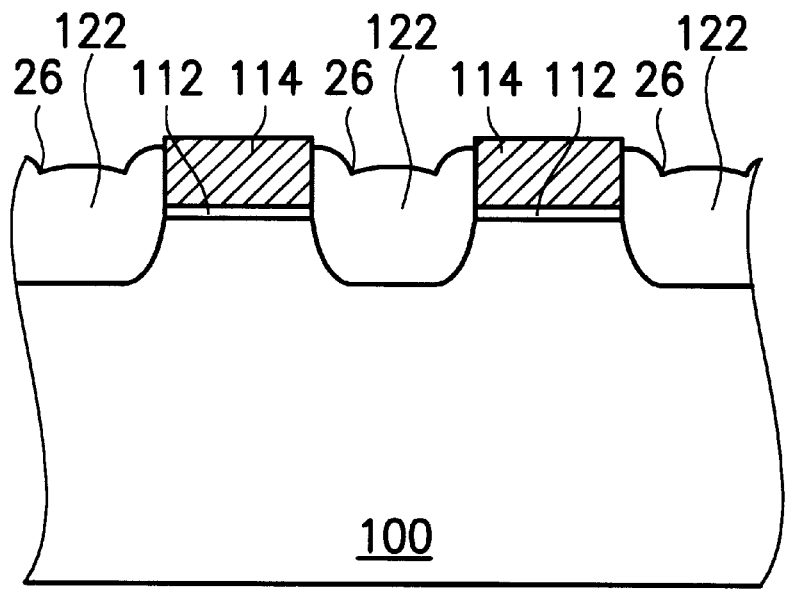

Next, as shown in FIG. 2F, a local oxide isolation 122 (field oxide), which has a shallower concave portion 26, is grown above the recess 115 by thermal oxidation which preferably uses a gas containing $H_2O$ and $O_2$ as the reactive gas.

Figure 2G:
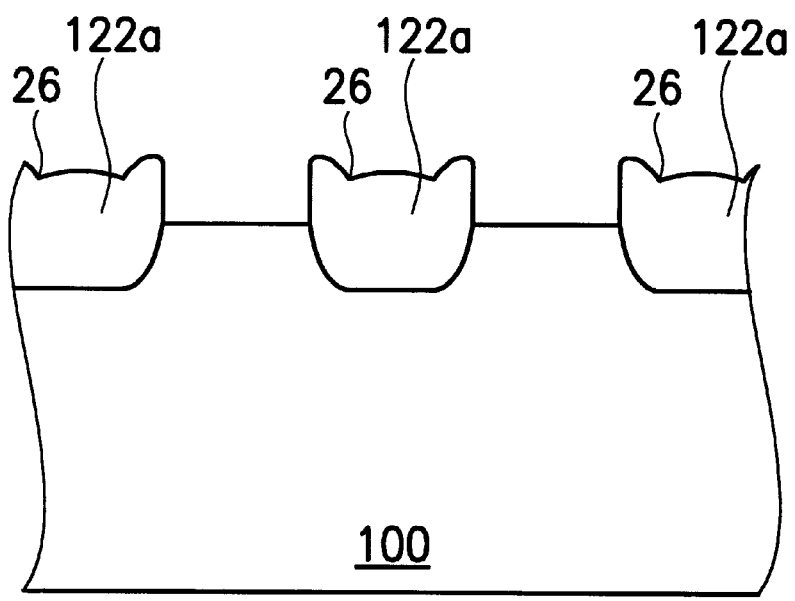

Afterwards, referring to FIG. 2G, the polishing stop layer 114 and the first pad oxide layer 112 are removed respectively by using phosphate etchant and hydrogen fluoride etchant, thereby leaving a local oxide isolation 122a (acting as a LOCOS isolation).

If necessary, the local oxide isolation 122a is then polished or etched to attain an isolation having an even surface.

The thin nitride layer 117 is formed before the deposition of the polysilicon 118 (that is, the spacer SC has a sealed thin nitride layer thereunder).

Due to the structure of the spacer SC, the concave portion 26 depth of the local oxide isolation 122 is decreased. Moreover, the problems of the prior art such as remains polysilicon remains, and the encroachment effect are eliminated.

What is claimed is:

1. A method for fabricating a LOCOS isolation, comprising the steps of:
   (a) forming a masking layer on an active region of a silicon substrate;
   (b) anistropically etching said silicon substrate by using said masking layer as an etching mask, thereby forming a recess;
   (c) depositing a thin nitride layer on the recess;
   (d) thereafter depositing a polysilicon layer on said thin nitride layer;
   (e) etching back said polysilicon layer and said thin nitride layer to expose said masking layer, thereby forming a polysilicon spacer extending said recess and said masking layer; and
   (f) growing a local oxidation of silicon (LOCOS) isolation above said recess, said isolation forming on a side wall of said masking layer.

2. A method for fabricating a LOCOS isolation as claimed in claim 1, wherein said masking layer is a silicon nitride layer.

3. A method for fabricating a LOCOS isolation as claimed in claim 2, wherein said silicon nitride layer has a thickness of somewhere between 1200 and 1800 Angstroms.

4. A method for fabricating a LOCOS isolation as claimed in claim 1, wherein said thin nitride layer is a silicon nitride layer.

5. A method for fabricating a LOCOS isolation as claimed in claim 1, wherein said thin nitride layer is a silicon oxynitride layer.

6. A method for fabricating a LOCOS isolation as claimed in claim 1, wherein said thin nitride layer in step (c) has a thickness of somewhere between 50 and 70 Angstroms.

7. A method for fabricating a LOCOS isolation as claimed in claim 1, wherein said recess in step (b) has a depth of somewhere between 300 and 700 Angstroms.

8. A method for fabricating a LOCOS isolation as claimed in claim 1, wherein said polysilicon layer in step (d) has a thickness of somewhere between 600 and 800 Angstroms.

* * * * *